(12) United States Patent
Akutsu et al.

(10) Patent No.: US 7,158,232 B2
(45) Date of Patent: Jan. 2, 2007

(54) SUBSTRATE PROCESSING APPARATUS

(75) Inventors: Kotaru Akutsu, Saitama (JP); Keiji Emoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/354,088

(22) Filed: Feb. 15, 2006

(65) Prior Publication Data

US 2006/0158650 A1    Jul. 20, 2006

Related U.S. Application Data

(62) Division of application No. 10/998,670, filed on Nov. 30, 2004, now Pat. No. 7,012,690, which is a division of application No. 10/090,149, filed on Mar. 5, 2002, now Pat. No. 6,879,382.

(30) Foreign Application Priority Data

Mar. 16, 2001 (JP) ............................. 2001/075652

(51) Int. Cl.
  *G01B 11/00* (2006.01)
(52) U.S. Cl. ................... 356/400; 356/399; 355/67; 355/68
(58) Field of Classification Search ........ 356/399–400; 355/53–67; 422/22, 30
See application file for complete search history.

(56) References Cited

U.S. PATENT DOCUMENTS

| | | | |
|---|---|---|---|
| 5,715,064 A | 2/1998 | Lin ........................ | 356/401 |
| 5,858,587 A | 1/1999 | Yamane et al. ............. | 430/22 |
| 5,864,389 A | 1/1999 | Osanai et al. .............. | 355/53 |
| 5,939,852 A | 8/1999 | Akutsu et al. ............. | 318/640 |
| 6,008,882 A | 12/1999 | Ito et al. .................... | 355/53 |
| 6,285,444 B1 | 9/2001 | Osanai et al. .............. | 355/72 |
| 6,404,505 B1 | 6/2002 | Matsui ....................... | 356/620 |
| 6,417,914 B1 | 7/2002 | Li ............................. | 355/75 |
| 6,495,847 B1 | 12/2002 | Asano et al. .............. | 250/548 |
| 6,549,269 B1 * | 4/2003 | Nishi et al. ................ | 355/53 |
| 6,690,450 B1 | 2/2004 | Nishi ........................ | 355/30 |
| 6,842,248 B1 | 1/2005 | Binnard et al. ............ | 356/401 |
| 2001/0028456 A1 | 10/2001 | Nishi ........................ | 356/400 |
| 2001/0055117 A1 | 12/2001 | Mizutani ................... | 356/401 |
| 2002/0063856 A1 | 5/2002 | Inoue ........................ | 355/53 |

* cited by examiner

*Primary Examiner*—Layla G. Lauchman
(74) *Attorney, Agent, or Firm*—Fitzpatrick, Cella, Harper & Scinto (57) ABSTRACT

In order to perform a measurement operation of a pattern and a processing operation in parallel while the positions of two substrate stages are accurately measured and wire/hose units are prevented from becoming tangled, a substrate processing apparatus includes an alignment system for measuring the pattern arrangements of the substrates, a processing system disposed separately from the alignment system and used for processing the substrates, substrate stages which are able to support the substrates and move in an xy plane, and position measurement systems which measure the positions of the substrate stages. Four position measurement systems are arranged for the measurement in the x direction, and three position measurement systems are arranged for the measurement in the y direction. One of the position measurement systems for the measurement in the y direction is disposed at a side opposite to the remaining positioning measurement systems across the substrate stages.

1 Claim, 11 Drawing Sheets

| | |
|---|---|
| URL | http://www.maintain.co.jp/db/input.html |

TROUBLESHOOTING DB ENTRY SCREEN

DATE [ 2000/3/15 ] ~ 1404
MODEL [ ********* ] ~ 1401
SUBJECT [ MALFUNCTION (START-UP ERROR) ] ~ 1403
S/N [ 465NS4580001 ] ~ 1402
DEGREE OF URGENCY [ D ] ~ 1405

SYMPTOM [ LED KEEPS FLASHING AFTER POWER HAS BEEN TURNED ON ] ~ 1406

REMEDY [ TURN ON POWER AGAIN (PRESS RED BUTTON DURING ACTIVATION) ] ~ 1407

PROGRESS [ TEMPORARY REPAIR HAS BEEN MADE ] ~ 1408

[SEND] [RESET]     1410                1411              1412
           LINK TO LIST OF RESULTS   SOFTWARE LIBRARY   OPERATION GUIDE

SUBSTRATE PROCESSING APPARATUS

This application is a divisional application of U.S. patent application Ser. No. 10/998,670, filed Nov. 30, 2004 now U.S. Pat. No. 7,012,690, which is a divisional application of U.S. patent application Ser. No. 10/090,149, filed Mar. 5, 2002, which issued as U.S. Pat. No. 6,879,382 on Apr. 12, 2005.

BACKGROUND OF THE INVENTION

1. Field of the Invention

The present invention relates to substrate processing apparatuses used for processing a substrate such as a wafer. Substrate processing apparatuses are suitable for use as projection exposure apparatuses in which an exposure process for a wafer is performed step-by-step by projecting a reticle pattern onto the wafer at a reduced size.

2. Description of the Related Art

Various methods for aligning a mask, such as a reticle, and a substrate to be exposed, such as a wafer, in a projection exposure apparatus, have been suggested. Generally, two typical aligning methods are known in the art: off-axis global alignment (hereinafter abbreviated as OAAA), and through-the-lens die-by-die alignment (hereinafter abbreviated as TTLAA).

In OAAA, the positions of a plurality of alignment marks formed on a single wafer are determined by an optical system other than a projection optical system. The wafer is moved in steps of a "predetermined distance" by using the alignment marks as a reference, and the areas corresponding to chips are exposed step-by-step. The "predetermined distance" is the interval between the chips on the wafer obtained on the basis of the alignment marks, and it is determined in advance in accordance with the pattern to be formed. Normally, a first shot position relative to the alignment marks, a second shot position relative to the first shot position, a third shot position relative to the second shot position, and so on, are determined in advance, and the interval between the shots is determined to be the "predetermined distance". In OAAA, the number of times the alignment is performed for a single wafer is small, so the alignment time is short and the exposure process of the wafer can be quickly performed. However, in a semiconductor manufacturing process, the positions of the chips relative to the alignment marks and intervals between the chips may be changed on the submicron scale. In such a case, the positional errors cannot be corrected in OAAA. In contrast, in TTLAA, the reticle and the wafer are aligned before each shot by using the projection optical system. Thus, the above-described disadvantage of the OAAA can be overcome by the TTLAA. However, since the alignment is performed before each shot, the alignment time is long and throughput of the exposure apparatus is reduced.

Figure 1:
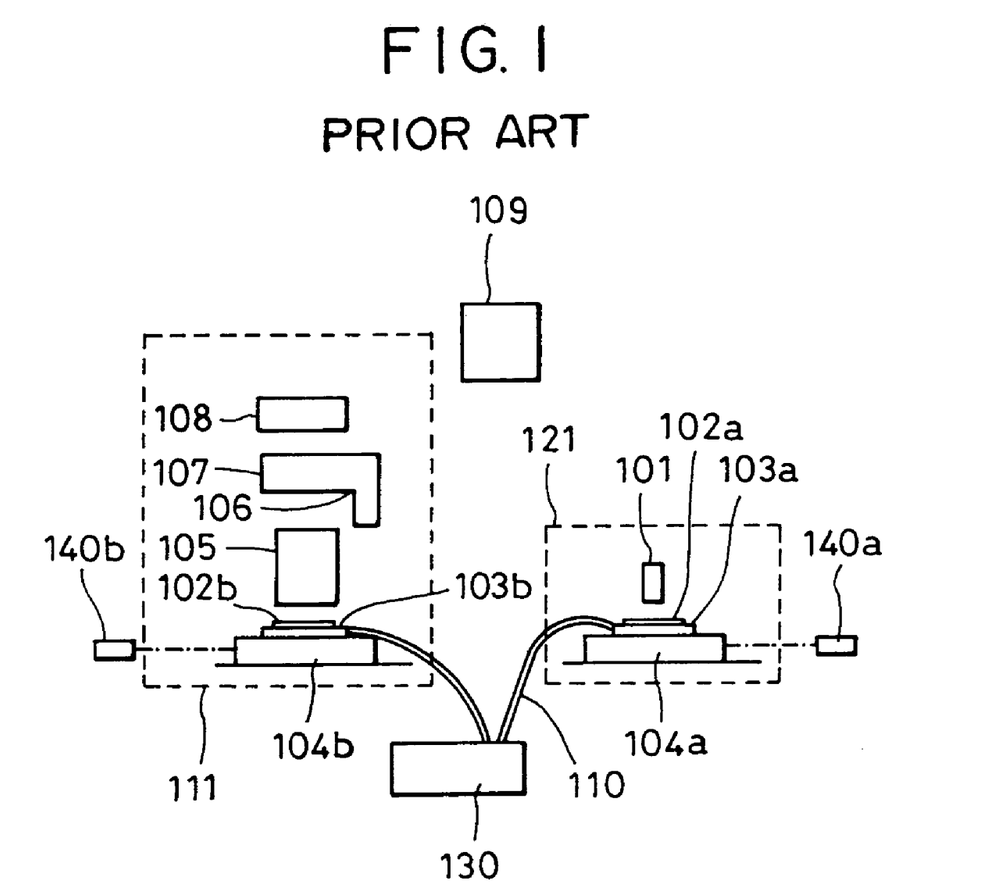
FIG. 1 is a schematic diagram showing a substrate processing apparatus of the known art.

In order to solve the above-described problems regarding the aligning methods, a substrate processing apparatus has been suggested in, for example, U.S. Pat. No. 5,715,064. This substrate processing apparatus will be described below with reference to FIG. 1. In FIG. 1, reference numeral 111 denotes an exposure processing unit, and 121 denotes a substrate measurement unit in which alignment is performed. In the substrate measurement unit 121, reference numeral 101 denotes an off-axis alignment optical system, 102a denotes a wafer, and 103a denotes a wafer chuck, which retains the wafer 102a by air suction. In the exposure processing unit 111, reference numeral 106 denotes a projection exposure system which projects the pattern of a reticle 106 onto a wafer 102b, 107 denotes a TTL alignment optical system, and 108 denotes an illumination optical system. In addition, reference numeral 109 denotes a central processing unit and 110 denotes hoses used for air suction. In the substrate measurement unit 121, the above-described "predetermined distance", that is, the distance, by which the wafer 102a placed on the wafer chuck 103a is moved before each shot, is measured. After the measurement, the wafer 102a is transferred to the exposure processing unit 111. The substrate processing apparatus includes at least two identical stages 104a and 104b. The stages 104a and 104b support the wafer chucks 103a and 103b, respectively, and move between the substrate measurement unit 121 and the exposure processing unit 111. The examples of the known art disclose a method for measuring the positions of the stages 104a and 104b. More specifically, as shown in FIG. 1, two interferometers 104a and 104b are disposed in a direction in which the substrate measurement unit 121 and the exposure processing unit 111 are aligned.

With regard to the above-described example of the known art, the inventors have recognized the necessity for considering different situations and dealing with each situation individually.

(1) A case is considered in which a series of processes including wafer supply, measurement, exposure, and wafer removal are performed, while a plurality of stages are being rotated between the substrate measurement unit and the exposure processing unit. In this case, a situation may occur in which laser beams cannot be radiated on the stages while the stages are aligned in a direction perpendicular to the direction in which the substrate measurement unit and the exposure processing unit are aligned (that is, the direction perpendicular to the page). If such a situation occurs, it becomes difficult to measure the positions of the stages while the stages are passing each other.

(2) The stages are provided with hoses for air suction and wires for sensors. Thus, when the stages are rotated between the substrate measurement unit while dragging the hoses and wires, a situation may occur in which the hoses and wires become tangled.

SUMMARY OF THE INVENTION

Accordingly, it is an object of the present invention to individually deal with a variety of conceivable situations regarding substrate processing apparatuses, including a plurality of stages, and to provide the most suitable substrate processing apparatus for each situation.

More specifically, an object of the present invention is to provide a high-accuracy substrate processing apparatus in which the positions of, for example, two stages are constantly measured with high accuracy. In addition, another object of the present invention is to provide a high-speed, high-accuracy substrate processing apparatus in which hoses and wires are prevented from becoming tangled.

Further objects, features and advantages of the present invention will become apparent from the following description of the preferred embodiments with reference to the attached drawings.

DESCRIPTION OF THE PREFERRED EMBODIMENTS

First Embodiment

Figure 2A:
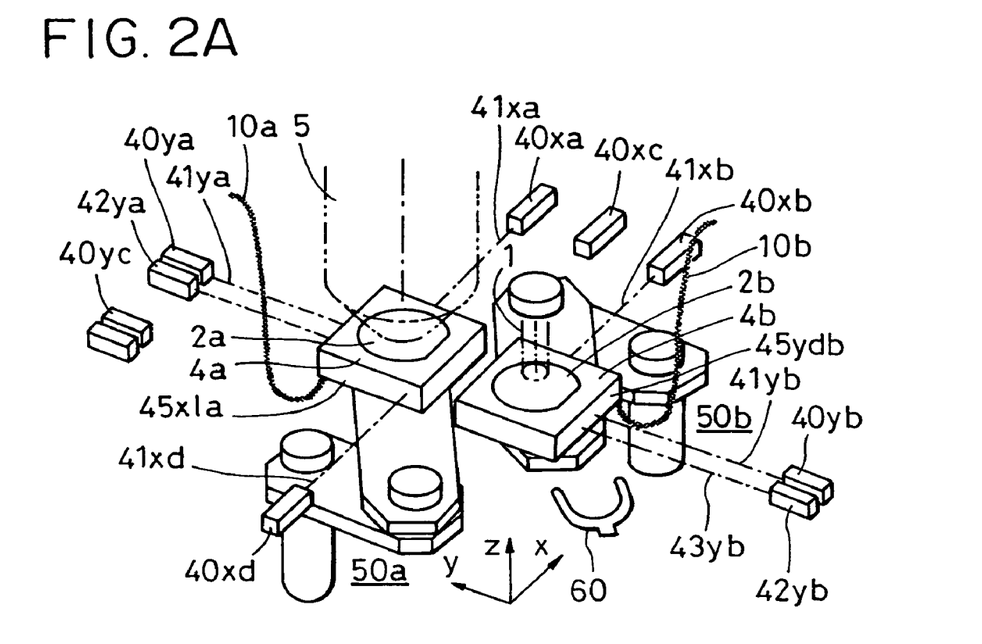
FIG. 2A is a perspective view of a substrate processing apparatus according to a first embodiment of the present invention.

FIG. 2A shows a substrate processing apparatus according to a first embodiment of the present invention. In the first embodiment, the substrate is a wafer, and the process is to transfer a predetermined pattern onto the wafer. In FIG. 2A, reference numeral 1 denotes an off-axis alignment optical system. In the alignment optical system 1, in order to accurately transfer a new pattern onto a pattern that is already formed on the wafer, the position of the old pattern is measured. Reference numeral 5 denotes a projection optical system by which the pattern is transferred onto the wafer. As shown in FIG. 2A, the axis passing through the alignment optical system 1 and the projection optical system 5 is defined as the y axis, and the axis perpendicular to the y axis in the horizontal plane is defined as the x axis. In addition, the axis perpendicular to the x and y axes is defined as the z axis.

Construction of the Stages

Reference numerals 2a and 2b denote wafers, and 4a and 4b denote two wafer stages, which are almost identical. The wafer stages 4a and 4b are able to support the wafers 2a and 2b, respectively, via chucking mechanisms and move them in the xy plane. In addition, the wafer stages 4a and 4b are able to move between the area of the alignment optical system 1 and the area of the projection optical system 5. Reference numerals 10a and 10b denote hose/wire units including hoses if air suction is utilized in the chucking mechanisms for retaining the wafers 2a and 2b, electrical wires if an electrostatic force is utilized in the chucking mechanisms, and wires of a measuring device, which measures the uniformity of the illumination intensity, etc.

The wafer stages 4a and 4b are moved in the xy plane by two-dimensional driving mechanisms 50a and 50b, which are articulated robots in the construction shown in FIG. 2A. From the viewpoint of physical constraint of the two-dimensional driving mechanisms, the wafer stages 4a and 4b cannot continuously rotate in one direction. Accordingly, the wire/hose units 10a and 10b of the wafer stages 4a and 4b never become tangled.

Figure 2B:
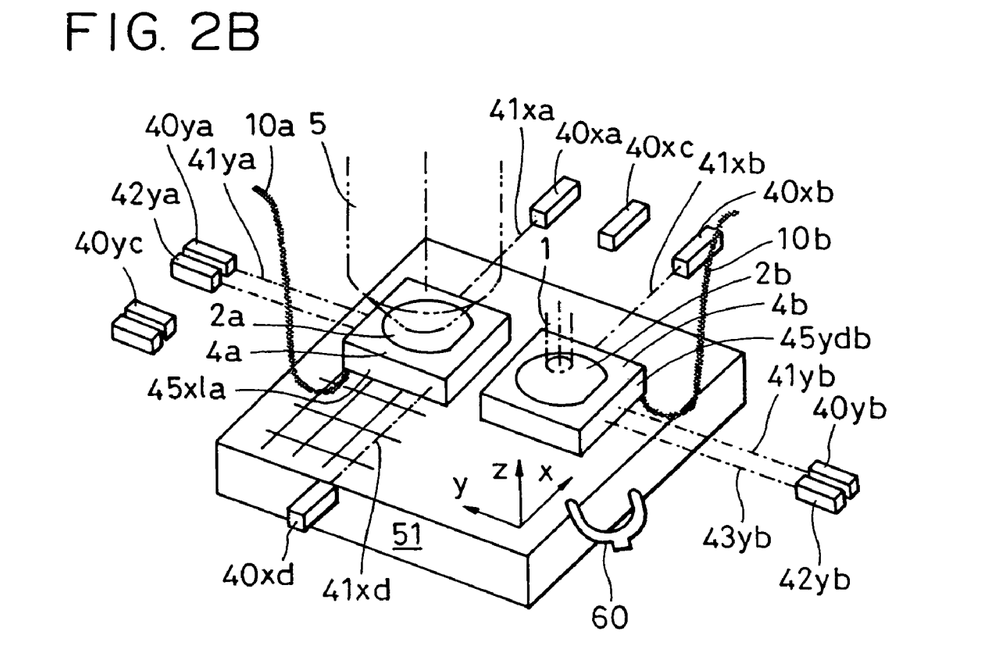
FIG. 2B is a perspective view of a substrate processing apparatus according to a modification of the first embodiment.

In the present embodiment, the two-dimensional driving mechanisms are not limited to the articulated robots. For example, as shown in FIG. 2B, a surface motor 51 may also be used as the two-dimensional driving mechanism. In such a case, the wafer stages 4a and 4b can be moved at a high speed, with high accuracy. Any kind of two-dimensional driving mechanism may be applied as long as a plurality of wafer stages 4a and 4b can be moved between the alignment area and the exposure area.

According to the construction of the two-dimensional driving mechanism shown in FIG. 2B, the wafer stages 4a and 4b are able to continuously rotate in one direction. In such a case, however, the wire/hose units 10a and 10b will become tangled. Accordingly, even when the two-dimensional driving mechanism is constructed such that the wafer stages 4a and 4b are able to continuously rotate in one direction, it is preferable that they do not continuously rotate in one direction. A state in which the wafer stage 4b is in the area of the alignment optical system 1 and the wafer stage 4a is in the area of the projection optical system 5, as shown in FIGS. 2A and 2B, is defined as a first state, and a state in which the wafer stage 4b is in the area of the projection optical system 5 and the wafer stage 4a is in the area of the alignment optical system 1 is defined as a second state. When the first state is changed to the second state, the wafer stages 4a and 4b rotate counterclockwise as seen from the top. Then, when the second state is changed to a third state (the third state is the same as the first state), the wafer stages 4a and 4b rotate clockwise, so that the wafer stage 4b moves toward the alignment optical system 1 and the wafer stage 4a moves toward the projection optical system 5. The above-described clockwise and counterclockwise rotations are alternatively performed.

In other words, every time the positions of the two wafer stages 4a and 4b are switched (e.g., every time the two wafer stages 4a and 4b are aligned in the x direction), the order in which the first and second substrate stages are aligned in the x direction (the positional relationship thereof) is the same. For example, the wafer stage 4b is always at the positive side (right side) of the wafer stage 4a in the x direction.

The wire/hose units 10a and 10b connected to the two wafer stages 4a and 4b, which move as described above, are preferably disposed at point-symmetric positions across the two stages. Reference numeral 60 denotes a hand which supplies and removes the wafers to/from the wafer stages 4a and 4b.

Position Measurement of the Stages

The positions of the wafer stages 4a and 4b in the xy plane are measured by using interferometers and reflection mirrors fixed to the wafer stages 4a and 4b. The reflection mirrors are fixed on four sides of the wafer stage 4a and three sides of the wafer stage 4b, and laser beams are selectively radiated on the reflection mirrors. The laser beams reflected by the reflection mirrors and reference beams are caused to be interfered with one another in the interferometers, so that accurate positions can be obtained.

In order to measure the position of the wafer stage 4a disposed at the projection optical system 5, which constructs the processing system, an x-interferometer 40xa for the measurement in the x direction, a y-interferometer 40ya for the measurement in the y direction, and another y-interferometer 42ya for measuring the rotational position around the z axis are disposed at the left side in FIG. 2A. In addition, in order to measure the position of the wafer stage 4b disposed at the alignment optical system 1, an x-interferometer 40xb for the measurement in the x direction, a y-interferometer 40yb for the measurement in the y direction, and another y-interferometer 42ya for measuring the rotational position around the z axis are disposed at the right side in FIG. 2A.

In the case in which the required accuracy of the rotational position around the z axis is not very high, the y-interferometers 42ya and 42yb can be omitted. In addition, in the case in which the rotational positions around the x and y axes must also be measured with high accuracy, commercial angle interferometers or three-axis interferometers may also be disposed in place of the x-interferometers 40xa, 40xb, 40xc, and 40xd and the y-interferometers 40ya, 40yb, and 40yc.

FIG. 2A shows a state in which the exposure process of the wafer 2a, which is placed on the wafer stage 4a and which has already undergone the measurement process, is being performed in the projection optical system 5. In addition, at the same time, the position of a pattern, flatness, etc., of the wafer 2b placed on the wafer stage 4b is measured in the alignment optical system 1. In descriptions hereof, a state in which "the wafer stage is in the area of the alignment optical system" refers to a state in which the wafer stage is at a position such that the pattern of a wafer placed on the wafer stage can be measured in the alignment optical system. In addition, a state in which "the wafer stage is in the area of the projection optical system" refers to a state in which the wafer stage is at a position such that the exposure process of a wafer placed on the wafer stage can be performed.

In order for the exposure process of the wafer 2b to start quickly at the projection optical system 5 after the measurement process at the alignment optical system 1, the wafer 2b is preferably moved to the projection optical system 5 with high accuracy. Therefore, the position of the wafer 2b must be continuously monitored by the laser interferometers. More specifically, the laser beams selectively radiated on the reflection mirrors must always return to the interferometers. The y-interferometer 40yc and the x-interferometers 40xc and 40xd shown in FIG. 2A are used for the position measurement, while the stages are moved.

Next, a method for selecting laser beams will be described with reference to FIGS. 3A to 3D.

FIGS. 3A to 3D are plan views showing the arrangement of the two wafer stages 4a and 4b and the measurement systems. Reference numeral 1 denotes the alignment optical system and reference numeral 5 denotes the projection optical system.

Figures 3A, 3B:
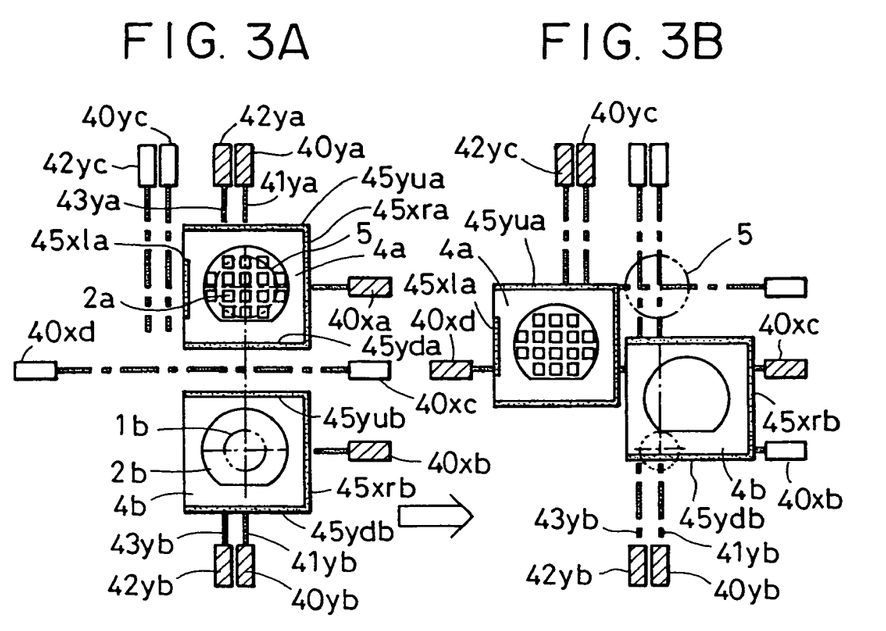
FIGS. 3A to 3D are plan views showing a method for selecting laser beams according to the first embodiment of the present invention.

In FIG. 3A, the wafer 2a placed on the wafer stage 4a is being subjected to the exposure process, and the position of the pattern of the wafer 2b placed on the wafer stage 4b is being measured in the alignment optical system 1. Accordingly, in FIG. 3A, the wafer stage 4a is in the area of the projection optical system 5 and the wafer stage 4b is in the area of the alignment optical system 1.

Figures 3C, 3D:
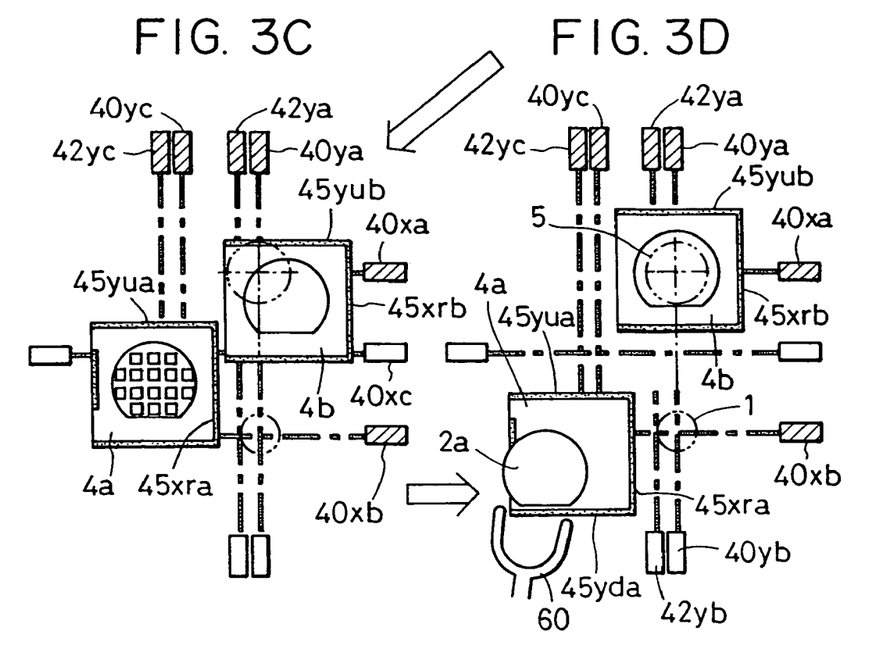

In FIG. 3D, the wafer stage 4b is in the area of the projection optical system 5. In addition, the wafer stage 4a is at a position such that the wafer, which has already undergone the exposure process, can be taken out by the hand 60 and a new wafer, which is to be subjected to the exposure process, can be supplied by the hand 60. In FIG. 3D, after the wafer stage 4a has received the new wafer, it moves to the area of the alignment optical system 1.

FIGS. 3B and 3C show ways in which the positions of the wafer stages 4a and 4b are measured while the wafer stages 4a and 4b are moved from the state shown in FIG. 3A to the state shown in FIG. 3D.

In FIGS. 3A to 3D, the x-interferometers 40xa to 40xc are disposed at the right side of the wafer stages 4a and 4b. The three x-interferometers 40xa to 40xc are aligned in the y direction with a gap smaller than the length of an x-reflection mirror 45xra. In addition, the x-interferometer 40xd is disposed at the opposite side across the wafer stages 4a and 4b in such a manner that the x-interferometer 40xd opposes the x-interferometer 40xc. Similarly, a pair of y-interferometers 40ya and 42ya and another pair of y-interferometers 40yc and 42yc are disposed at the upper side of the wafer stages 4a and 4b in the figures. The two pairs of y-interferometers are aligned in the x direction in such a manner that the gap therebetween is smaller than the length of a y-reflection mirror 45yua. In addition, a pair of y-interferometers 40yb and 42yb are disposed at the opposite side across the wafer stages 4a and 4b in such a manner that the y-interferometers 40yb and 42yb oppose the y-interferometers 40ya and 42ya. The x-interferometers 40xa to 40xc are not necessarily arranged with a constant interval.

In FIG. 3A, the position of the wafer stage 4a in the x direction is measured by the x-interferometer 40xa by causing a laser beam radiated on and reflected by the x-reflection mirror 45xra in a direction approximately perpendicular thereto to interfere with a laser beam reflected by a fixed mirror. In FIGS. 3A to 3D, interferometers used for the position measurement are indicated by slanting lines. In addition, the position of the wafer stage 4a in the y direction and the rotational position thereof around the z axis (hereinafter shown by q) are measured by the y-interferometers 40ya and 42ya by causing laser beams 41ya and 43ya radiated on and reflected by the y-reflection mirror 45yua in a direction approximately perpendicular thereto to interfere with a laser beam reflected by a fixed mirror.

In addition, the position of the wafer stage 4b in the x direction is measured by the x-interferometer 40xb by causing a laser beam radiated on and reflected by the x-reflection mirror 45xrb in a direction approximately perpendicular thereto to interfere with a laser beam reflected by a fixed mirror. In addition, the position in the y direction and rotation q of the wafer stage 4b are measured by the y-interferometers 40yb and 42yb by causing laser beams 41yb and 43yb radiated on and reflected by the y-reflection mirror 45ydb in a direction approximately perpendicular thereto to interfere with a laser beam reflected by a fixed mirror.

Then, as shown in FIG. 3B, while the wafer stages 4a and 4b rotate counterclockwise (the wafer stage 4b moves toward the upper right and the wafer stage 4a moves toward the lower left), the x-interferometer that measures the position of the wafer stage 4b in the x direction is changed from the x-interferometer 40xb to the x-interferometer 40xc. In addition, the position in the y direction and rotation q of the wafer stage 4b are measured by the y-interferometers 40yb and 42yb by causing laser beams 41yb and 43yb radiated on and reflected by the y-reflection mirror 45ydb in a direction approximately perpendicular thereto to interfere with a laser beam reflected by a fixed mirror.

In addition, with respect to the wafer stage 4a, the x-interferometer that measures the position thereof in the x direction is changed from the x-interferometer 40xa to the x-interferometer 40xd. In addition, the position in the y direction and rotation θ are measured by the y-interferometers 40yc and 42yc by causing laser beams radiated on and reflected by the y-reflection mirror 45yua in a direction approximately perpendicular thereto to interfere with a laser beam reflected by a fixed mirror.

Then, as shown in FIG. 3C, while the wafer stages 4a and 4b further rotate counterclockwise (the wafer stage 4a moves downward and the wafer stage 4b moves upward), the x-interferometer that measures the position of the wafer stage 4b in the x direction is changed from the x-interferometer 40xc to the x-interferometer 40xa. In addition, the y-interferometers that measure the position in the y direction and rotation q of the wafer stage 4b are changed to the y-interferometers 40ya and 42ya, which cause the laser beams radiated on and reflected by the y-reflection mirror 45yub in a direction approximately perpendicular thereto to interfere with a laser beam reflected by a fixed mirror.

In addition, with respect to the wafer stage 4a, the x-interferometer that measures the position thereof in the x direction is changed from the x-interferometer 40xd to the x-interferometer 40xb. In addition, the position in the y direction and rotation q are measured by the y-interferometers 40yc and 42yc by causing laser beams radiated on and reflected by the y-reflection mirror 45yua in a direction approximately perpendicular thereto to interfere with a laser beam reflected by a fixed mirror.

Then, in the state shown in FIG. 3D, the wafer 2b placed on the wafer stage 4b is subjected to the exposure process in the projection optical system 5. At the same time, the wafer 2a, which is placed on the wafer stage 4a and which has already undergone the exposure process, is taken out by the hand 60, and a new wafer is supplied to the wafer stage 4a. Then, the position of the pattern of the new wafer is measured in the alignment optical system 1. Although not shown in the figure, when the position of the pattern is measured, the y-interferometers that measure the position in the y direction and rotation q of the wafer stage 4a are changed to the y-interferometers 40yb and 42yb, which cause laser beams radiated on and reflected by the y-reflection mirror 45yda in a direction approximately perpendicular thereto to interfere with a laser beam reflected by a fixed mirror.

Then, in the subsequent processes, the wafer stages 4a and 4b are moved clockwise in the reverse order (FIG. 3D→FIG. 3C→FIG. 3B→FIG. 3A). Accordingly, counterclockwise and clockwise rotations are alternately performed. The reason the counterclockwise rotation (FIG. 3A→FIG. 3B→FIG. 3C→FIG. 3D) is not continuously performed is to prevent the wire/hose units from becoming tangled.

According to the above-described processes, the positions of the two wafer stages can always be determined with high accuracy by selectively radiating the laser beams. In addition, the wire/hose units can be prevented from becoming tangled.

Second Embodiment

FIGS. 4A to 4D are plan views showing the arrangement of the two wafer stages 4a and 4b and measurement systems according to a second embodiment.

Reflection mirrors are fixed on three sides of each of the wafer stages 4a and 4b, and laser beams are selectively radiated on the reflection mirrors. The laser beams reflected by the reflection mirrors and reference beams are caused to interfere with one another in interferometers, so that accurate positions of the wafer stages 4a and 4b in the xy plane can be obtained. In the second embodiment, y-interferometers are arranged similarly to the first embodiment. However, x-interferometers are arranged differently from the first embodiment, and x-interferometers 44xa and 40xa for the position measurement in the projection optical system 5, x-interferometers 44xb and 40xb for the position measurement in the alignment optical system 1, and x-interferometers 44xc and 40xc for the position measurement in the middle area are provided. Accordingly, six x-interferometers in total are arranged.

In FIGS. 4A to 4D, the x-interferometers 40xa to 40xc disposed at the right side oppose the x-interferometers 44xa to 44xc, respectively, which are disposed at the left side. The x-interferometers 40xa to 40xc and the x-interferometers 44xa to 44xc are aligned in the y direction with a constant interval that is smaller than the lengths of the x-reflection mirrors 45xla and 45xrb. However, the x-interferometers 40xa to 40xc and 44xa to 44xc are not necessarily arranged with a constant interval.

The operations of position measurement and processing will be described below with reference to FIGS. 4A to 4D. Since the position measurement in the y direction is similar to that in the first embodiment, explanations thereof are omitted.

Figures 4A, 4B:
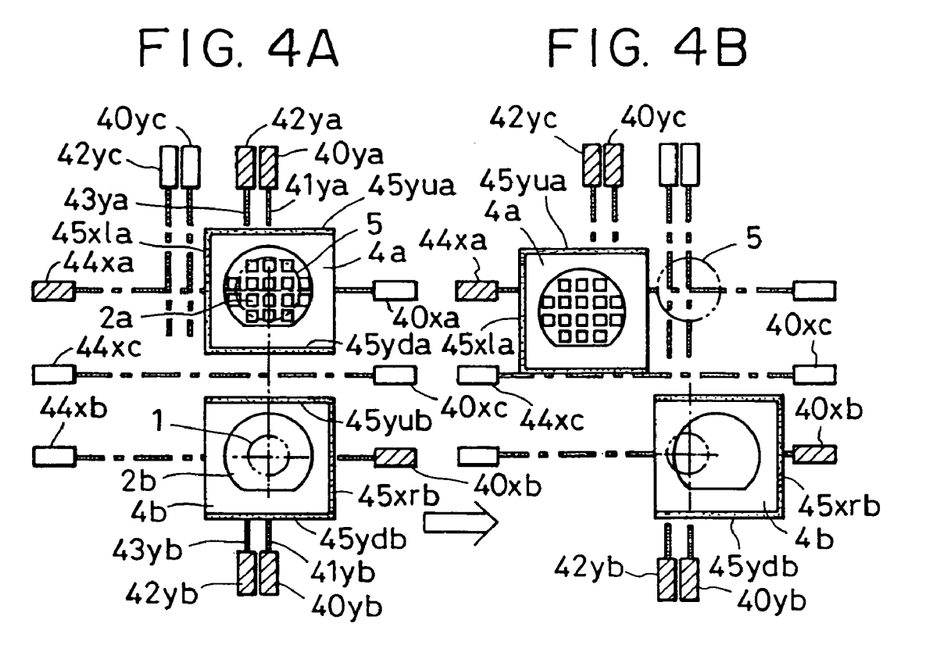
FIGS. 4A to 4D are plan views showing a method for selecting laser beams according to a second embodiment of the present invention.

In FIG. 4A, the position of the wafer stage 4a in the x direction is measured by the x-interferometer 44xa by causing a laser beam radiated on and reflected by the x-reflection mirror 45xla in a direction approximately perpendicular thereto to interfere with a laser beam reflected by a fixed mirror.

In addition, the position of the wafer stage 4b in the x direction is measured by the x-interferometer 40xb by causing a laser beam radiated on and reflected by the x-reflection mirror 45xrb in a direction approximately perpendicular thereto to interfere with a laser beam reflected by a fixed mirror.

Then, as shown in FIG. 4B, while the wafer stages 4a and 4b rotate counterclockwise (the wafer stage 4b moves toward the right and the wafer stage 4a moves toward the lower left), the position of the wafer stage 4b in the x direction is continuously measured by the x-interferometer 40xb. In addition, the position of the wafer stage 4a in the x direction is continuously measured by the x-interferometer 44xa.

Figures 4C, 4D:
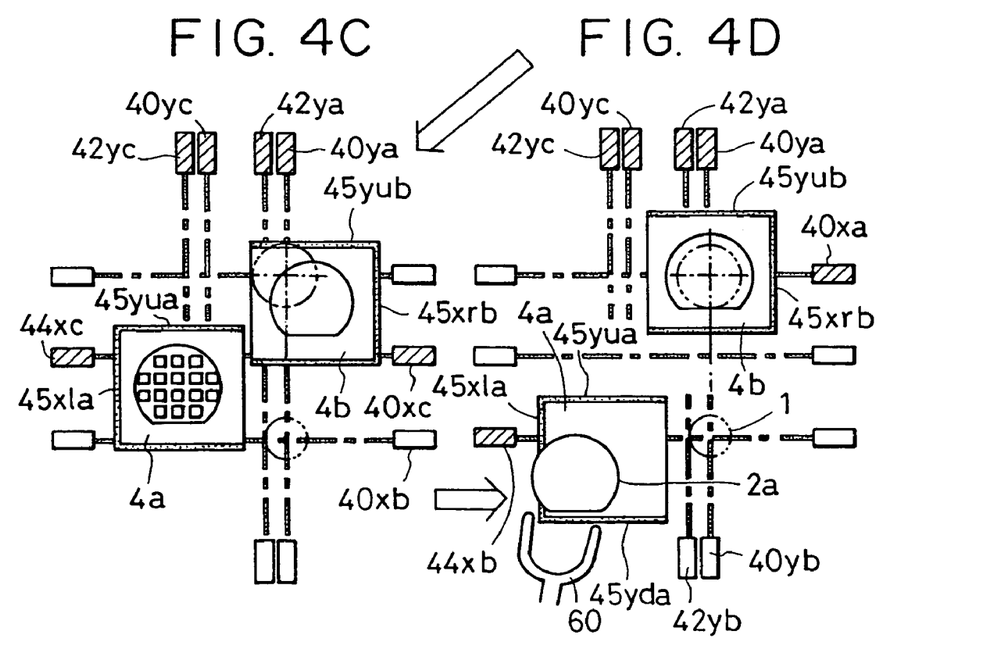

Then, as shown in FIG. 4C, while the wafer stages 4a and 4b further rotate counterclockwise (the wafer stage 4a moves downward and the wafer stage 4b moves upward), the x-interferometer that measures the position of the wafer stage 4b in the x direction is changed from the x-interferometer 40xb to the x-interferometer 40xc. In addition, the x-interferometer that measures the position of the wafer stage 4a in the x direction is changed from the x-interferometer 44xa to the x-interferometer 44xc.

Then, in the state shown in FIG. 4D, the x-interferometer that measures the position of the wafer stage 4b in the x direction is changed from the x-interferometer 40xc to the x-interferometer 40xa. The wafer 2b placed on the wafer stage 4b is subjected to the exposure process in the projection optical system 5. At the same time, the wafer 2a, which is placed on the wafer stage 4a and which has already undergone the exposure process, is taken out by the hand 60, and a new wafer is supplied to the wafer stage 4a. Then, the position of the pattern of the new wafer is measured in the alignment optical system 1. The x-interferometer that measures the position of the wafer stage 4a in the x direction is changed from the x-interferometer 44xc to the x-interferometer 44xb. Although not shown in the figure, when the position of the pattern is measured, the y-interferometers that measure the position in the y direction and rotation q of the wafer stage 4a are changed to the y-interferometers 40yb and 42yb, which cause laser beams radiated on and reflected by the y-reflection mirror 45yda in a direction approximately perpendicular thereto to interfere with a laser beam reflected by a fixed mirror.

Then, in the subsequent processes, the wafer stages 4a and 4b are moved clockwise in the reverse order (FIG. 4D→FIG. 4C→FIG. 4B→FIG. 4A). Accordingly, counterclockwise and clockwise rotations are alternately performed. The reason the counterclockwise rotation (FIG. 4A→FIG. 4B→FIG. 4C→FIG. 4D) is not continuously performed is to prevent the wire/hose units from becoming tangled.

According to the present embodiment, only three sides of each wafer stage are provided with mirrors, and the mirrors are disposed at symmetric positions. Accordingly, semiconductor devices can be manufactured with high reliability.

Third Embodiment

FIGS. 5A to 5D are plan views showing a third embodiment of the present invention.

Reflection mirrors are fixed on three sides of each of the wafer stages 4a and 4b, and laser beams are selectively radiated on the reflection mirrors. The laser beams reflected by the reflection mirrors and reference beams are caused to interfere with one another in interferometers, so that accurate positions of the wafer stages 4a and 4b in the xy plane can be obtained. As shown in these figures, x-reflection mirrors 55xla and 55xrb are long enough to protrude beyond the wafer stages 4a and 4b, respectively, in the y direction.

In the third embodiment, y-interferometers are arranged similarly to the first embodiment. With respect to the x-interferometers, x-interferometers 44xa and 40xa for the position measurement in the projection optical system 5 are disposed such that the x-interferometers 44xa and 40xa oppose each other, and x-interferometers 44xb and 40xb for the position measurement in the alignment optical system 1 are disposed such that the x-interferometers 44xb and 40xb oppose each other. The x-interferometers 40xa and 40xb and the x-interferometers 44xa and 44xb are aligned in the y direction with gaps smaller than the lengths of the x-reflection mirrors 55xla and 55xrb.

Figures 5A, 5B:
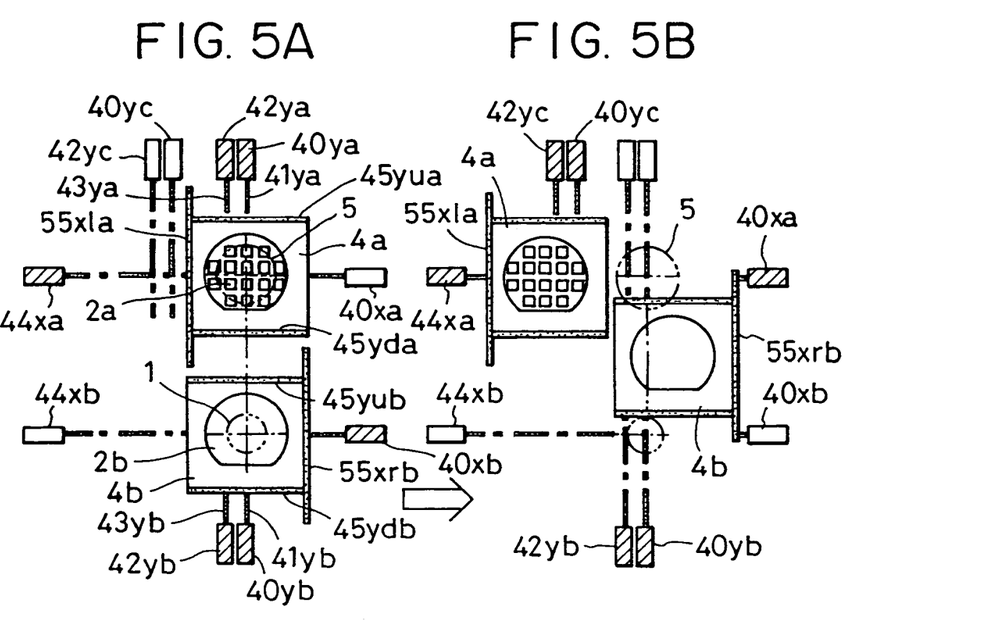
FIGS. 5A to 5D are plan views showing a method for selecting laser beams according to a third embodiment of the present invention.
Figure 5C:
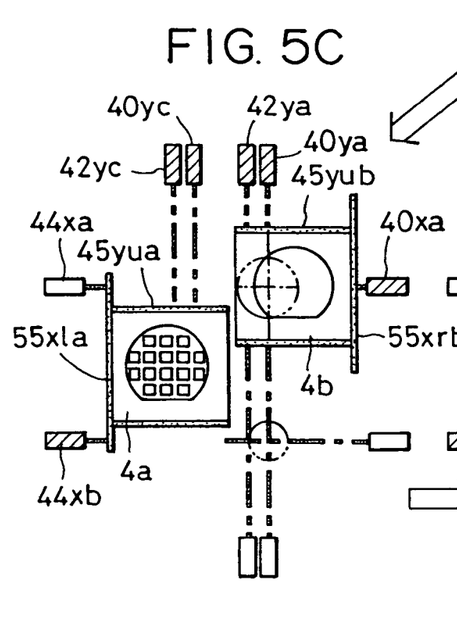

In the third embodiment, the x-reflection mirrors 55xla and 55xrb are sufficiently long so that there is a region in which both the interferometer for the position measurement in the projection optical system 5 and the interferometer for the position measurement in the alignment optical system 1 can be used (FIG. 5B for the wafer stage 4b and FIG. 5C for the wafer stage 4a). The operations of position measurement and processing will be described below with reference to FIGS. 5A to 5D. Since the position measurement in the y direction is similar to that in the first embodiment, explanations thereof are omitted.

In FIG. 5A, the position of the wafer stage 4a in the x direction is measured by the x-interferometer 44xa by causing a laser beam radiated on and reflected by the x-reflection mirror 55xla in a direction approximately perpendicular thereto to interfere with a laser beam reflected by a fixed mirror.

In addition, the position of the wafer stage 4b in the x direction is measured by the x-interferometer 40xb by causing a laser beam radiated on and reflected by the x-reflection mirror 55xrb in a direction approximately perpendicular thereto to interfere with a laser beam reflected by a fixed mirror.

Then, as shown in FIG. 5B, while the wafer stages 4a and 4b rotate counterclockwise (the wafer stage 4b moves toward the upper right and the wafer stage 4a moves toward the lower left), the x-interferometer that measures the position of the wafer stage 4b in the x direction is changed from the x-interferometer 40xb to the x-interferometer 40xa. The position of the wafer stage 4a in the x direction is continuously measured by the x-interferometer 44xa.

Then, as shown in FIG. 5C, while the wafer stages 4a and 4b further rotate counterclockwise (the wafer stage 4a moves downward and the wafer stage 4b moves upward), the position of the wafer stage 4b in the x direction is continuously measured by the x-interferometer 40xa. The x-interferometer that measures the position of the wafer stage 4a in the x direction is changed from the x-interferometer 44xa to the x-interferometer 44xb.

Figure 5D:
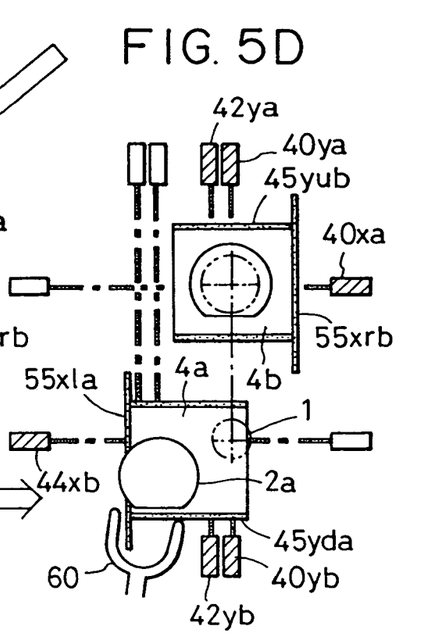

Then, in the state shown in FIG. 5D, the position of the wafer stage 4b in the x direction is continuously measured by the x-interferometer 40xa. The wafer 2b placed on the wafer stage 4b is subjected to the exposure process in the projection optical system 5. At the same time, the wafer 2a, which is placed on the wafer stage 4a and which has already undergone the exposure process, is taken out by the hand 60, and a new wafer is supplied to the wafer stage 4a. Then, the position of the pattern of the new wafer is measured in the alignment optical system 1. The position of the wafer stage 4a in the x direction is continuously measured by the x-interferometer 44xb. When the position of the pattern is measured, the y-interferometers that measure the position in the y direction and rotation q of the wafer stage 4a are changed to the y-interferometers 40yb and 42yb, which cause laser beams radiated on and reflected by the y-reflection mirror 45yda in a direction approximately perpendicular thereto to interfere with a laser beam reflected by a fixed mirror.

Then, in the subsequent processes, the wafer stages 4a and 4b are moved clockwise in the reverse order (FIG. 5D→FIG. 5C→FIG. 5B→FIG. 5A). Accordingly, the counterclockwise and clockwise rotations are alternately performed. The reason the counterclockwise rotation (FIG. 5A→FIG. 5B→FIG. 5C→FIG. 5D) is not continuously performed is to prevent the wire/hose units from becoming tangled.

According to the present embodiment, the number of x-interferometers can be reduced compared with those used in the first and second embodiments, and only four x-interferometers are required.

Fourth Embodiment

FIGS. 6A to 6D are plan views showing a fourth embodiment of the present invention.

Reflection mirrors are fixed on three sides of each of the wafer stages 4a and 4b, and laser beams are selectively radiated on the reflection mirrors. The laser beams reflected by the reflection mirrors and reference beams are caused to interfere with one another in interferometers, so that accurate positions of the wafer stages 4a and 4b in the xy plane can be obtained. The length of x-reflection mirror 55xra fixed on the wafer stage 4a is longer than the length of the wafer stage 4b in the y direction. In the fourth embodiment, y-interferometers are arranged similarly to the first embodiment. With respect to the x-interferometers, an x-interferometer 40xa for the position measurement in the projection optical system 5, an x-interferometer 40xb for the position measurement in the alignment optical system 1, and an x-interferometer 40xc for the position measurement in the middle area are provided. Accordingly, three x-interferometers in total are arranged. In the fourth embodiment, the x-reflection mirror 55xra of the wafer stage 4a is longer than the distance between the x-interferometers 40xa and 40xb disposed at both ends, and the distance between the x-interferometers 40xa and 40xb is longer than the length of the x-reflection mirror 45xrb. Therefore, even when the positions of the wafer stages 4a and 4b are switched (even when the wafer stages 4a and 4b are aligned in the x direction), the x-reflection mirror 55xra is able to receive the laser beam for the position measurement of the wafer stage 4a (stage 4a in FIGS. 6B and 6C).

The operations of position measurement and processing will be described below with reference to FIGS. 6A to 6D. Since the position measurement in the y direction is similar to that in the first embodiment, explanations thereof are omitted.

Figures 6A, 6B:
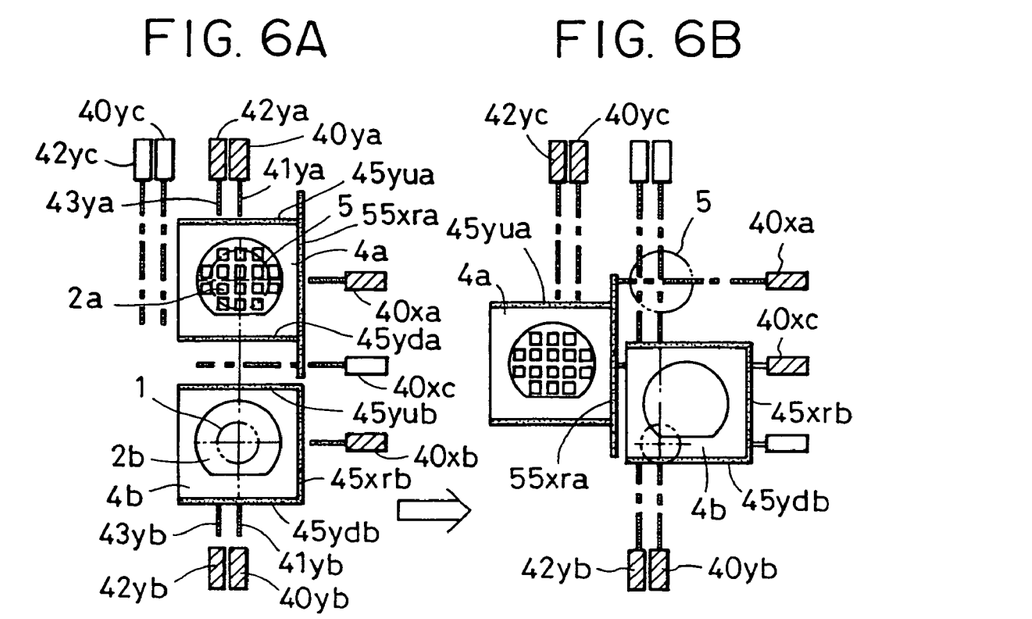
FIGS. 6A to 6D are plan views showing a method for selecting laser beams according to a fourth embodiment of the present invention.

In FIG. 6A, the position of the wafer stage 4a in the x direction is measured by the x-interferometer 40xa by causing a laser beam radiated on and reflected by the x-reflection mirror 55xra in a direction approximately perpendicular thereto to interfere with a laser beam reflected by a fixed mirror.

In addition, the position of the wafer stage 4b in the x direction is measured by the x-interferometer 40xb by causing a laser beam radiated on and reflected by the x-reflection mirror 45xrb in a direction approximately perpendicular thereto to interfere with a laser beam reflected by a fixed mirror.

Then, as shown in FIG. 6B, while the wafer stages 4a and 4b rotate counterclockwise (the wafer stage 4b moves toward the upper right and the wafer stage 4a moves toward the lower left), the position of the wafer stage 4a in the x direction is continuously measured by the x-interferometer 40xa. In addition, the x-interferometer that measures the position of the wafer stage 4b in the x direction is changed from the x-interferometer 40xb to the x-interferometer 40xc.

Figure 6C:
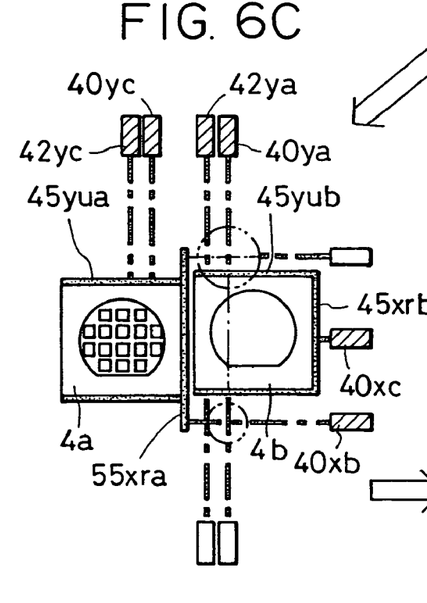

Then, as shown in FIG. 6C, while the wafer stages 4a and 4b further rotate counterclockwise (the wafer stage 4a moves downward and the wafer stage 4b moves upward), the position of the wafer stage 4b in the x direction is continuously measured by the x-interferometer 40xc. The x-interferometer that measures the position of the wafer stage 4a in the x direction is changed from the x-interferometer 40xa to the x-interferometer 40xb.

Figure 6D:
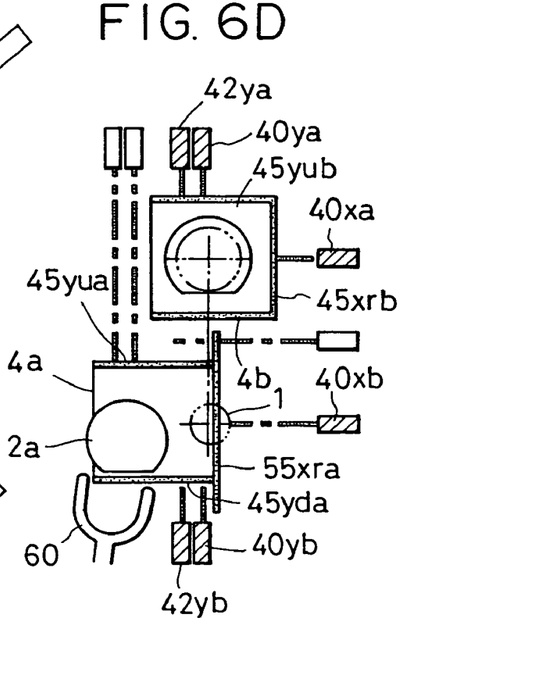

Then, in the state shown in FIG. 6D, the x-interferometer that measures the position of the wafer stage 4b in the x direction is changed from the x-interferometer 40xc to the x-interferometer 40xa. The wafer 2b placed on the wafer stage 4b is subjected to the exposure process in the projection optical system 5. At the same time, the wafer 2a, which is placed on the wafer stage 4a and which has already undergone the exposure process, is taken out by the hand 60, and a new wafer is supplied to the wafer stage 4a. Then, the position of the pattern of the new wafer is measured in the alignment optical system 1. The position of the wafer stage 4a in the x direction is measured by the x-interferometer 40xb by causing a laser beam radiated on and reflected by the x-reflection mirror 55xra in a direction approximately perpendicular thereto to interfere with a laser beam reflected by a fixed mirror. When the position of the pattern is measured, the y-interferometers that measure the position in the y direction and rotation q of the wafer stage 4a are changed to the y-interferometers 40yb and 42yb, which cause laser beams radiated on and reflected by the y-reflection mirror 45yda in a direction approximately perpendicular thereto to interfere with a laser beam reflected by a fixed mirror.

Then, in the subsequent processes, the wafer stages 4a and 4b are moved clockwise in the reverse order (FIG. 6D→FIG. 6C→FIG. 6B→FIG. 6A). Accordingly, the counterclockwise and clockwise rotations are alternately performed. The reason the counterclockwise rotation (FIG. 6A→FIG. 6B→FIG. 6C→FIG. 6D) is not continuously performed is to prevent the wire/hose units from becoming tangled.

According to the present embodiment, the number of the x-interferometers can be further reduced, and only three x-interferometers are required.

Embodiment of a Semiconductor Production System

Next, a production system for producing a semiconductor device (e.g., a semiconductor chip such as an IC and LSI, a liquid crystal panel, a CCD, a thin-film magnetic head, a micromachine, etc.) will be explained below. This production system includes the substrate processing device according to the present invention, which serves as an exposure device. In this production system, maintenance services including troubleshooting, periodic maintenance, software distribution, etc., for manufacturing apparatuses installed in a semiconductor manufacturing factory are provided via a computer network external to the manufacturing factory.

Figure 7:
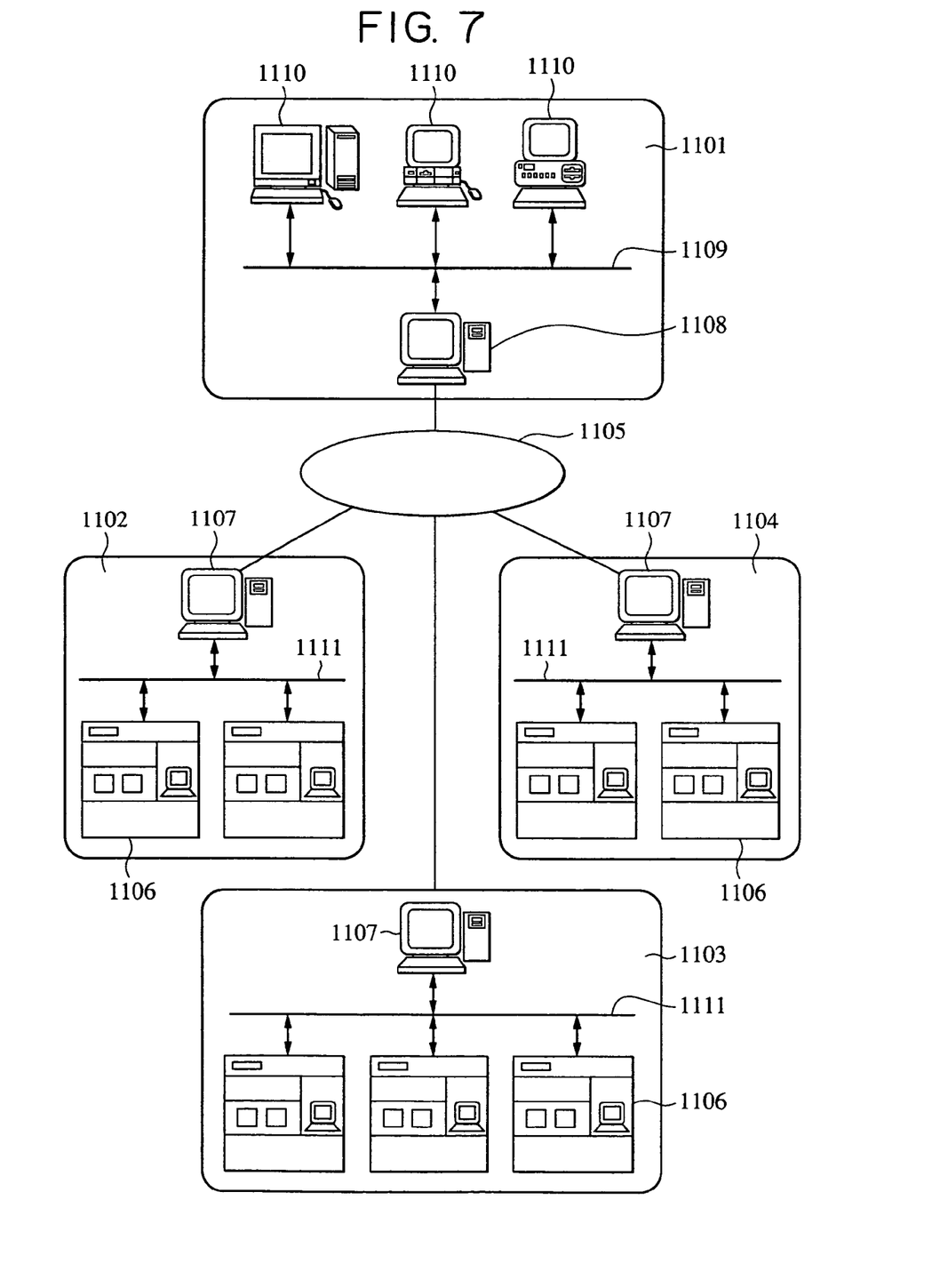
FIG. 7 is a schematic diagram of a semiconductor device production system including an apparatus according to the present invention.

FIG. 7 is a schematic diagram of the overall system as seen from a certain point of view. In FIG. 7, reference numeral 1101 denotes an office of a vendor (apparatus manufacturer) who provides manufacturing apparatuses of a semiconductor device. The manufacturing apparatuses are assumed to be semiconductor manufacturing apparatuses used for various kinds of processes in semiconductor manufacturing factories. For example, the manufacturing apparatuses may be apparatuses used in front-end processes (e.g., a lithography apparatus such as an exposure apparatus, a resist processing apparatus, an etching apparatus, etc., a heat treatment apparatus, a film forming apparatus, a planarization apparatus, etc.) and apparatuses used in back-end processes (e.g., an assembly apparatus, a testing apparatus, etc.). The office 1101 includes a host management system 1108, which provides a maintenance database for the manufacturing apparatuses, a plurality of operation terminal computers 1110, and a local area network (LAN) 1109, which constructs an intranet by connecting the host management system 1108 and the terminal computers 1110. The host management system 1108 includes a gateway for connecting the LAN 1109 to the Internet 1105, which is a network external to the office, and a security function for restricting access from the outside.

Reference numerals 1102 to 1104 denote factories of semiconductor manufacturers who use the manufacturing apparatuses. The factories 1102 to 1104 may belong to different manufacturers or to a single manufacturer (for example, a factory for front-end processes, a factory for back-end processes, etc.). Each of the factories 1102 to 1104 includes a plurality of manufacturing apparatuses 1106, a local area network (LAN) 1111, which constructs an intranet by connecting the manufacturing apparatuses 1106, and a host management system 1107, which serves as a monitoring apparatus for monitoring the operations of the manufacturing apparatuses 1106. The host management system 1107 installed in each of the factories 1102 to 1104 includes a gateway for connecting the LAN 1111 to the Internet 1105, which is the network external to the factory. Accordingly, the LAN 1111 of each factory is able to access the host management system 1108 of the vendor 1101 via the Internet 1105. The access to the host management system 1108 is restricted only to the authorized users by the security function of the host management system 1108. More specifically, the factories 1102 to 1104 are able to send information regarding the operational state of each manufacturing apparatus 1106 (for example, symptoms of trouble that has occurred in the manufacturing apparatus) to the vendor 1101 via the Internet 1105. In addition, the factories 1102 to 1104 are able to receive a response to the information (for example, information regarding the method for troubleshooting, software and data for troubleshooting, etc.) as well as the latest software, and maintenance information, such as help information, etc., from the vendor 1101. A typical communication protocol (TCP/IP) used in the Internet may be used for the data communication between the factories 1102 to 1104 and the vendor 1101. Instead of the Internet, a private line network (e.g., an ISDN, and the like), which cannot be accessed by a third party and which, therefore, has a higher degree of security, may also be used as the external network. The host management system is not necessarily provided by the vendor. Alternatively, the user may construct a database on the external network and allow a plurality of factories that belong to the user to access the database.

Figure 8:
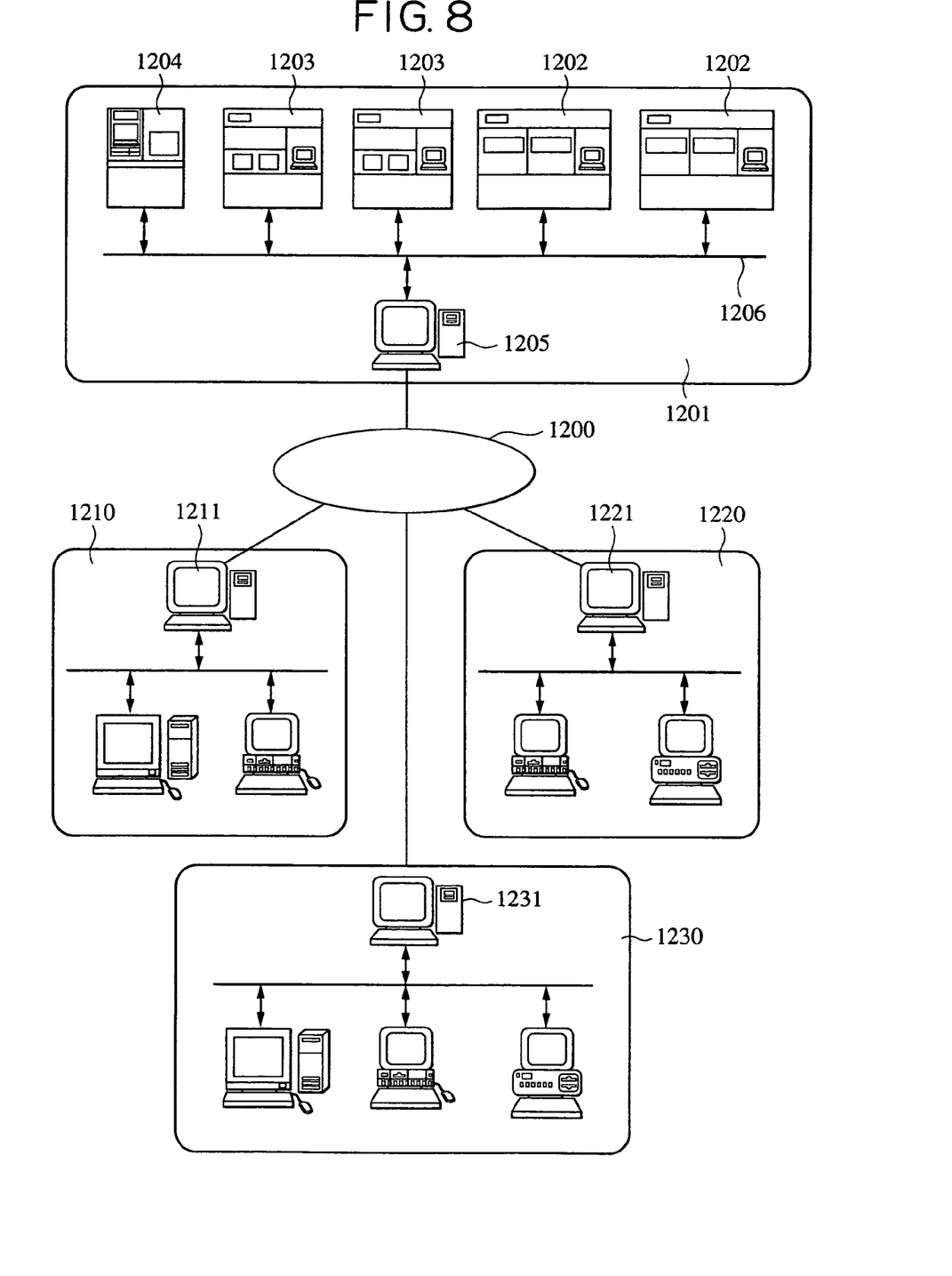
FIG. 8 is a schematic diagram of the semiconductor device production system including an apparatus according to the present invention as seen from another point of view.

FIG. 8 is a schematic diagram of the semiconductor production system as seen from another point of view. In FIG. 7, a plurality of factories, each of which has manufacturing apparatuses, are connected to the host management system of the vendor who supplies the manufacturing apparatuses via the external network. Accordingly, information regarding production management of each factory and/or information regarding at least one manufacturing apparatus are transmitted via the external network. In contrast, in FIG. 8, a factory having a plurality of manufacturing apparatuses provided by different vendors and the vendors of the manufacturing apparatuses are connected via the external network, so that maintenance information for each of the manufacturing apparatuses can be transmitted. In FIG. 8, reference numeral 1201 denotes the manufacturing factory of a user (e.g., a semiconductor device manufacturer), in which manufacturing apparatuses for performing various processes (for example, exposure apparatuses 1202, a resist processing apparatus 1203, and a film forming apparatus 1204) are arranged in a manufacturing line. Although only one manufacturing factory 1201 is shown in FIG. 8, a plurality of factories are similarly connected to the network in actuality. A LAN 1206 constructs an intranet by connecting the manufacturing apparatuses, and the operation of the manufacturing line is controlled by a host management system 1205.

The offices of the vendors (e.g., apparatus manufacturers), such as an exposure apparatus manufacturer 1210, a resist processing apparatus manufacturer 1220, and a film forming apparatus manufacturer 1230, include host management systems 1211, 1221, and 1231, each of which performs remote maintenance of the manufacturing apparatus supplied from the corresponding vendor. As described above, each of the host management systems 1211, 1221, and 1231 includes a maintenance database and a gateway to the external network. The host management system 1205 controlling the manufacturing apparatuses in the factory of the user is connected to the host management systems 1211, 1221, and 1231 of the vendors of the manufacturing apparatuses via an external network 1200, which may be the Internet or a private line network. In this system, when trouble occurs in one of the manufacturing apparatuses in the manufacturing line, the operation of the entire manufacturing line stops. However, remote maintenance of the manufacturing apparatus can be quickly performed by the corresponding vendor via the Internet 1200, so that a time interval in which the operation of the manufacturing line is stopped can be minimized.

Figure 9:
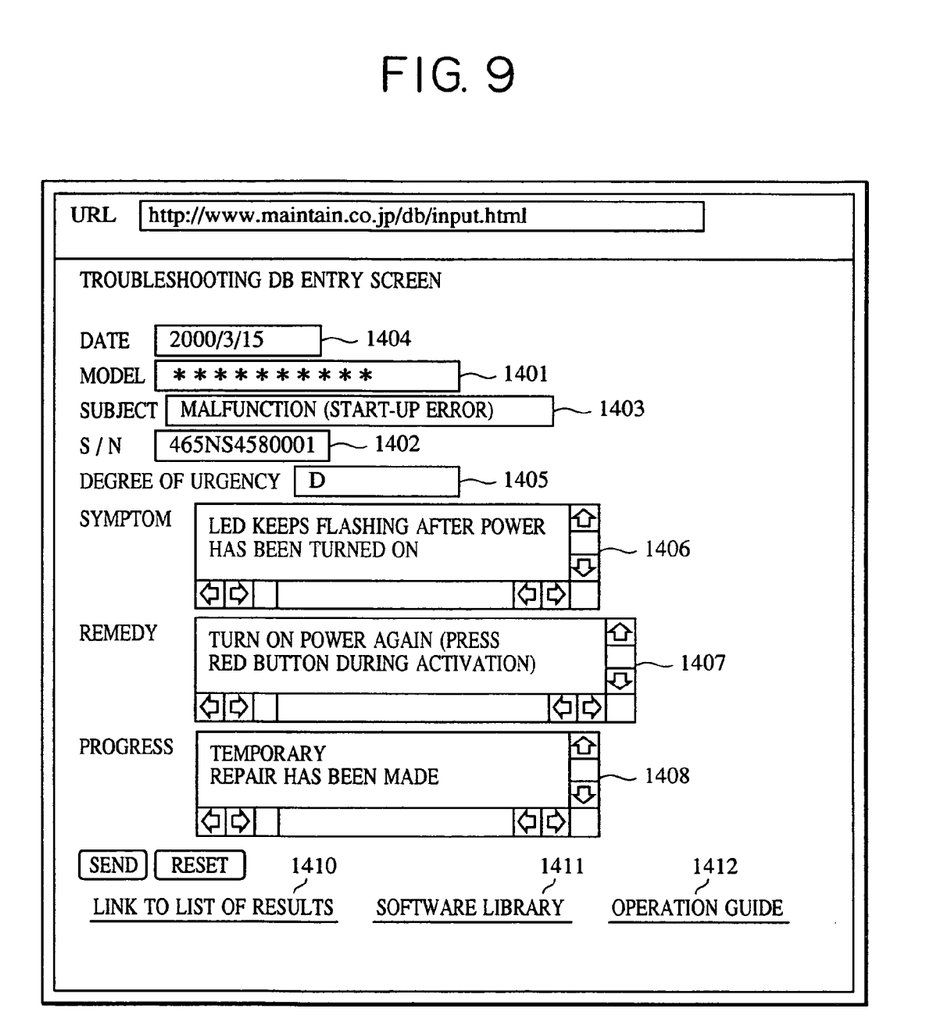
FIG. 9 is a schematic diagram showing an example of a user interface.

Each manufacturing apparatus installed in the semiconductor manufacturing factory includes a display, a network interface, network-accessing software stored in a memory, and a computer for executing software for operating the manufacturing apparatus. The memory may be an internal memory, a hard disk, a network file server, etc. The above-described network-accessing software includes a dedicated or general-purpose web browser and provides a user interface on the display. An example of the user interface is shown in FIG. 9. An operator of the manufacturing apparatus in the factory inputs the information of the manufacturing apparatus such as model (1401), serial number (1402), subject of the trouble (1403), date of occurrence (1404), degree of urgency (1405), symptom of the trouble (1406), remedy for the trouble (1407), progress (1408), etc. The information input by the user is transmitted to the maintenance database via the Internet, and suitable maintenance information is transmitted from the maintenance database and shown on the display. In addition, as shown in FIG. 9, the user interface provided by the web browser further provides hyperlinks 1410 to 1412, so that the operator can access more detailed information for each item, download the latest software for the manufacturing apparatus from a software library provided by the vendor, or obtain an operation guide (help information) useful as a reference for the operator. The maintenance information provided by the maintenance database includes information regarding the above-described substrate processing apparatus of the present invention, and the software library provides the latest software with which the present invention can be realized.

Figure 10:
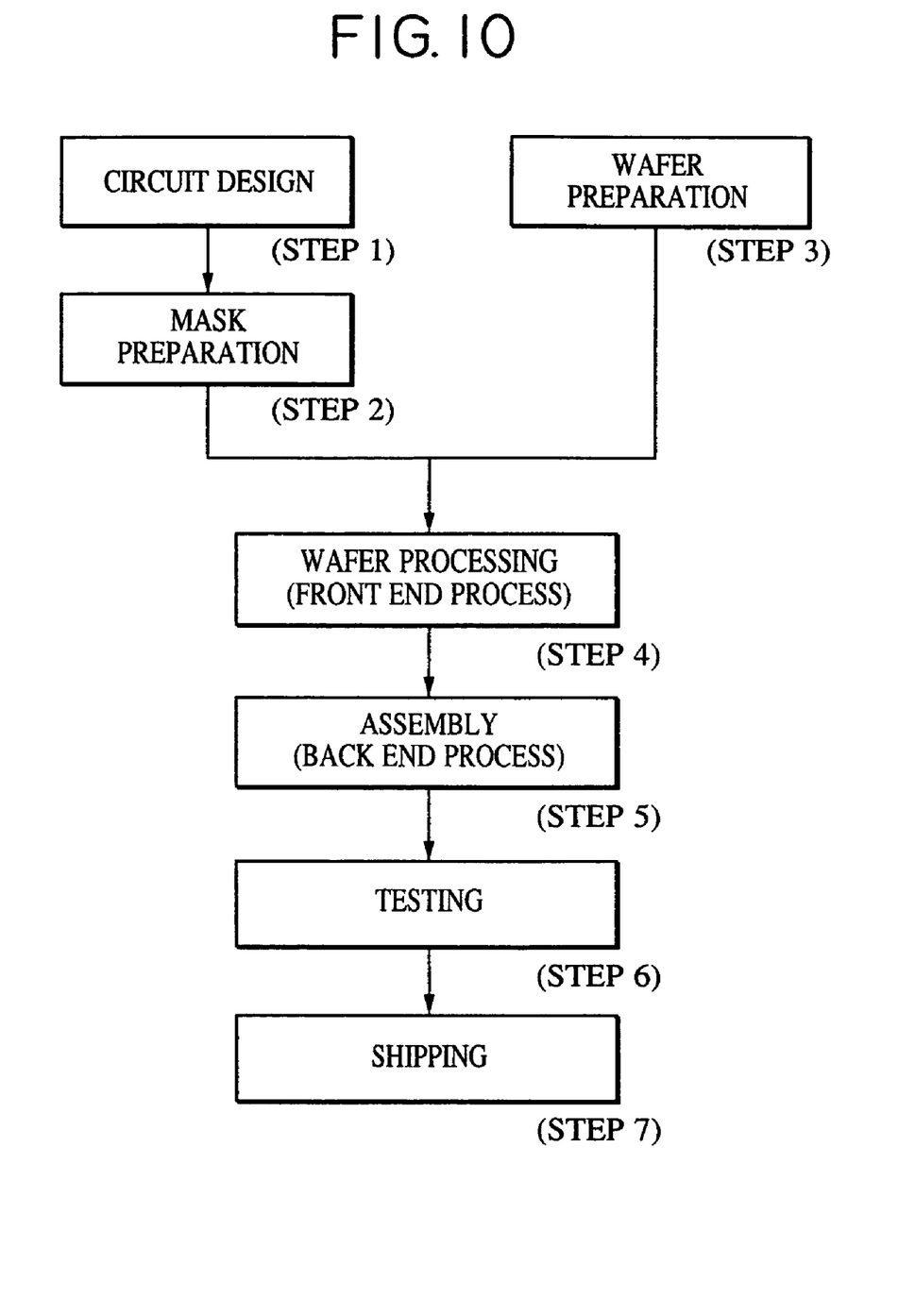
FIG. 10 is a flowchart showing processes for manufacturing a device.

Next, manufacturing processes of a semiconductor device using the above-described production system will be described below. FIG. 10 is a flowchart showing an overall flow of manufacturing processes for manufacturing the semiconductor device. In step 1 (circuit design), circuits for the semiconductor device are designed. In step 2 (mask preparation), a mask in which the designed circuit pattern is formed is manufactured. In step 3 (wafer preparation), a wafer is manufactured from, for example, silicon. Step 4 (wafer processing) is known as a front-end process, and actual circuits are formed on the wafer by a lithographic technique using the above-described mask and wafer. Step 5 (assembly) is known as a back-end process, and semiconductor chips are formed by using the wafer processed at Step 4. Step 5 includes assembly processes (dicing and bonding), packaging processes (enclosing of the chips), etc. In Step 6 (testing), various tests including operation tests, durability tests, etc., of the semiconductor device formed at Step 5 are performed. Accordingly, the semiconductor device is completed, and is then shipped (Step 7). The front-end process and the back-end process are performed at different factories, and maintenance of the manufacturing apparatuses is performed in each factory by the above-described remote maintenance system. In addition, information regarding production control and apparatus maintenance is transmitted between the factory for the front-end processes and the factory for the back-end processes via the Internet or the private line network.

Figure 11:
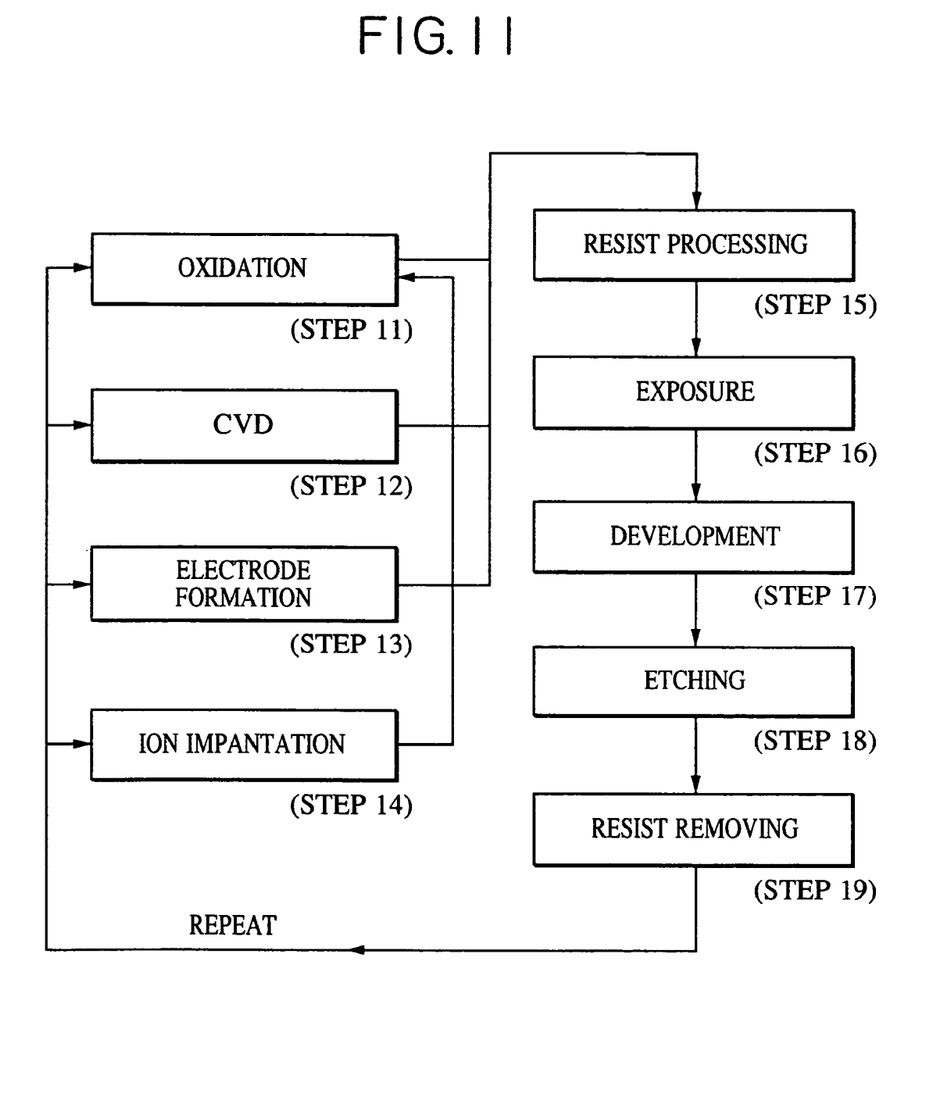
FIG. 11 is a flowchart showing a wafer process.

FIG. 11 is a flowchart showing the above-described wafer process in detail. In Step 11 (oxidation), the surface of the wafer is oxidized. In Step 12 (CVD), an insulating layer is formed on the surface of the wafer. In Step 13 (electrode formation), electrodes are formed on the wafer by vapor deposition. In Step 14 (ion implantation), ions are implanted in the wafer. In Step 15 (resist processing), a photosensitive material is applied on the wafer. In Step 16 (exposure), exposure of the wafer is performed by the above-described substrate processing apparatus, which serves as an exposure apparatus, so that the circuit pattern is formed on the mask.

In Step 17 (development), the exposed wafer is developed. In Step 18 (etching), parts which are not covered by the resist are etched. In Step 19 (resist removing), the resist, which is not necessary after the etching, is removed. By repeating the above-described steps, the circuit pattern having multiple levels is formed. Since the maintenance of the manufacturing apparatuses used in the above-described steps is performed by the remote maintenance system, trouble can be prevented. Even when trouble has occurred, troubleshooting can be quickly performed, so that the productivity of the semiconductor device can be increased.

As described above, according to the above-described embodiments, the positions of the two substrate stages can be accurately measured by selectively radiating laser beams. In addition, the hose/wire units can be prevented from becoming tangled, and the alignment and processing can be performed in parallel at high speed, with high accuracy. Accordingly, a high-speed, high accuracy substrate processing apparatus can be provided.

In addition, when a plurality of position measurement systems are disposed at each side of the two substrate stages, the number of reflection mirrors can be reduced. In addition, when, in a plurality of reflection surfaces by which the beams are reflected, the reflection surfaces used for the position measurement in the x direction are long enough to protrude in the y direction, the required number of position measurement systems can be reduced. Furthermore, when the position measurement systems are disposed only at the side facing the reflection surface protruding form the substrate stage, the required number of position measurement systems can be further reduced.

As described above, the present invention is suitably applied to a projection exposure apparatus. However, the present invention realizes a high accuracy positioning of, for example, two stages of which the positions are changed alternately, and is not exclusively applied to a projection exposure apparatus.

Except as otherwise discussed herein, the various components shown in outline or in block form in the Figures are individually well known and their internal construction and operation are not critical either to the making or using or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

We claim:

1. An exposure apparatus comprising:
   first and second stages;
   an alignment optical system configured to measure a pattern of a substrate placed on the first stage;
   a projection optical system configured to perform exposure process of a substrate placed on the second stage in parallel with the measured pattern;
   a driving system configured to swap the first stage in the area of the alignment optical system for second stage in the area of the projection optical system; and
   a measurement system configured to measure rotational positions of the first and second stages during swapping.

* * * * *